(12) United States Patent
Jenkins et al.

(10) Patent No.: US 7,231,114 B2
(45) Date of Patent: Jun. 12, 2007

(54) MULTIMODE FIBER OPTICAL FIBER TRANSMISSION SYSTEM WITH OFFSET LAUNCH SINGLE MODE LONG WAVELENGTH VERTICAL CAVITY SURFACE EMITTING LASER TRANSMITTER

(75) Inventors: David Jenkins, Stanton (GB); Christopher Park, Stowmarket (GB)

(73) Assignee: OCP-Europe, Ltd., Edmunds, Suffolk (GB)

( * ) Notice: Subject to any disclaimer, the term of this patent is extended or adjusted under 35 U.S.C. 154(b) by 214 days.

(21) Appl. No.: 10/851,484

(22) Filed: May 22, 2004

(65) Prior Publication Data

US 2005/0259916 A1    Nov. 24, 2005

Related U.S. Application Data

(60) Provisional application No. 60/472,278, filed on May 21, 2003.

(51) Int. Cl.
*G02B 6/42* (2006.01)

(52) U.S. Cl. .............................. 385/31; 385/33; 385/39; 372/103

(58) Field of Classification Search ................... 385/33, 385/39, 31; 372/103
See application file for complete search history.

(56) References Cited

U.S. PATENT DOCUMENTS

| | | | |
|---|---|---|---|
| 5,077,815 A | 12/1991 | Yoshizawa et al. | 385/28 |
| 5,315,680 A | 5/1994 | Musk et al. | 385/88 |
| 5,416,862 A | 5/1995 | Haas et al. | 385/28 |
| 5,574,738 A | 11/1996 | Morgan | 372/28 |
| 5,914,976 A | 6/1999 | Jayaraman et al. | 372/50 |
| 6,064,786 A | 5/2000 | Cunningham et al. | 385/38 |
| 6,195,485 B1 | 2/2001 | Coldren et al. | 385/49 |
| 6,304,352 B1 | 10/2001 | Cunningham et al. | 359/152 |
| 6,330,382 B1 | 12/2001 | Harshbarger et al. | 385/28 |
| 6,349,159 B1 | 2/2002 | Uebbing et al. | 385/33 |
| 6,400,450 B1 | 6/2002 | Golowich et al. | 356/73.1 |
| 6,419,404 B1 | 7/2002 | Deri et al. | 385/89 |
| 6,438,303 B1 | 8/2002 | Abbott, III et al. | 385/123 |
| 6,451,150 B2* | 9/2002 | Feldman et al. | 156/250 |
| 6,501,884 B1 | 12/2002 | Golowich et al. | 385/38 |
| 6,510,265 B1 | 1/2003 | Giaretta et al. | 385/38 |
| 6,522,437 B2 | 2/2003 | Presley et al. | 359/152 |
| 6,527,455 B2 | 3/2003 | Jian | 385/88 |
| 6,530,697 B1 | 3/2003 | Johnson et al. | 385/88 |

(Continued)

OTHER PUBLICATIONS

J.E.George, et al, "Laser Optimized Multimode Fibers . . . ", National Fiber Optic Engineers Conference, 2001 Technical Proceedings, pp. 351-361, date unknown.

(Continued)

*Primary Examiner*—Frank G. Font
*Assistant Examiner*—James P. Hughes
(74) *Attorney, Agent, or Firm*—Barlow, Josephs & Holmes, Ltd.

(57) ABSTRACT

A multimode fiber optical fiber transmission system includes an improved configuration for launching a single mode long wavelength transmission signal into existing multimode optical fiber networks. More specifically, the invention utilizes new single mode long wavelength VCSEL devices to realize a novel transmitter/transceiver for multimode fiber links where offset launch with controlled mode conditioning is achieved without the use of a mode conditioning patchcord, and in some embodiments, without the use of any collecting or focusing elements.

3 Claims, 19 Drawing Sheets

U.S. PATENT DOCUMENTS

| | | |
|---|---|---|
| 6,570,905 B1 | 5/2003 | Ebeling .................. 372/96 |
| 2002/0009258 A1 | 1/2002 | Coldren et al. .............. 385/24 |
| 2002/0041741 A1 | 4/2002 | Ciemiewicz ................ 385/89 |
| 2002/0054737 A1 | 5/2002 | Jian ........................... 385/49 |
| 2002/0181524 A1 | 12/2002 | Vusirikala .................... 372/43 |
| 2002/0181899 A1 | 12/2002 | Tartaglia et al. .............. 385/89 |
| 2003/0043862 A1 | 3/2003 | Jacobiwitz et al. ........... 372/20 |
| 2003/0072526 A1 | 4/2003 | Kathman et al. ............. 385/31 |

OTHER PUBLICATIONS

David Smith, "Characterizing Components for High Speed Data Interconnects", Honeywell, Micro Switch Sensing and Control, pp. 1-6, date unknown.

Christopher T. DiMinico, "10 Gigabit Ethernet Cabling Considerations", Cable Design Technologies (CDT) Corp., pp. 1-6, date unknown.

Mark Nowell, "Multimode Fiber Bandwidth Issues-Impact on 1394b Specification", Hewlett-Packard Laboratories, Bristol, UK, 15 pages, date unknown.

Tess Abidi, "Optimizing Fiber Coupling Effectiveness for Next-generation Optical Communications Applications", Laser Focus World, pp. 1-9, date unknown.

C. Carlsson, et al., "High Performance Microwave Link Using a Multimode VCSEL . . . ", Dept. of Microelectronics, Chalmers Univ. of Technology, Goteborg, Sweden, 4 pgs, date unknown.

Richard Dixon, et al., "Commercializing long-wavelength VCSELs", Compound Semiconductor magazine, Jun. 2001, pp. 1-4.

"Honeywell VCSEL Optical Products business Introduces Long Wavelength Components", News Release, Richardson, TX May 7, 2002.

Chih-Hao Chang, et al., "Study of Long-Wavelength VCSEL-VCSEL Injection . . . ", IEEE Photonics Technology Letters, vol. 14, No. 11, Nov. 2002.

L. Chrostowski, et al., "Study of Long-Wavelength Directly Modulated VCSEL . . . ", U.C. Berkeley, CA, 2 pgs, date unknown.

* cited by examiner

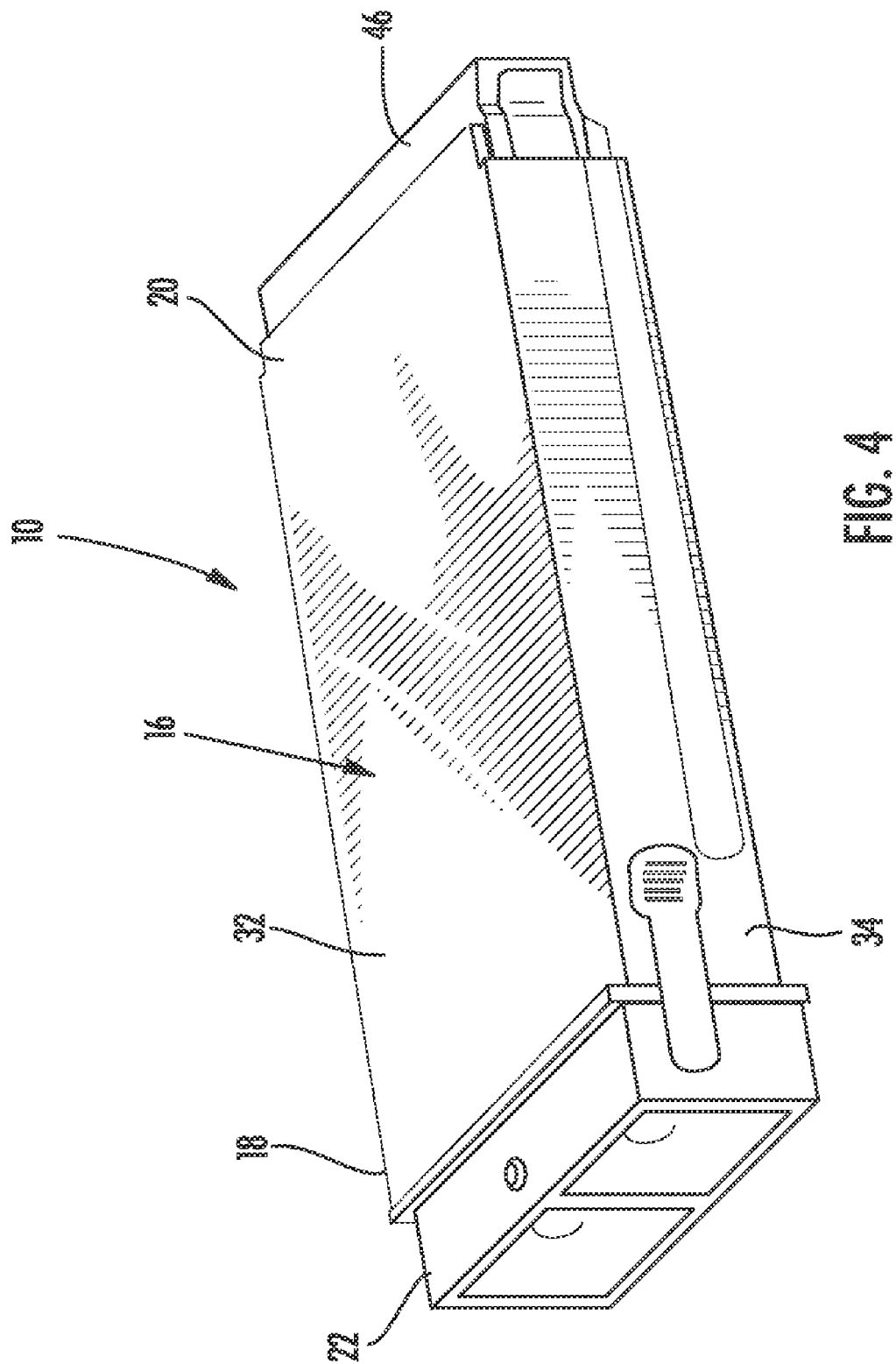

MULTIMODE FIBER OPTICAL FIBER TRANSMISSION SYSTEM WITH OFFSET LAUNCH SINGLE MODE LONG WAVELENGTH VERTICAL CAVITY SURFACE EMITTING LASER TRANSMITTER

CROSS-REFERENCE TO RELATED APPLICATIONS AND CLAIM OF PRIORITY

This application claims the priority benefit of U.S. Provisional Patent Application No. 60/472,278, filed May 21, 2003, entitled "MULTIMODE FIBER OPTICAL FIBER TRANSMISSION SYSTEM WITH OFFSET LAUNCH SINGLE MODE LONG WAVELENGTH VERTICAL CAVITY SURFACE EMITTING LASER TRANSMITTER".

BACKGROUND OF THE INVENTION

The present invention relates to optical fiber transmission systems and more particularly to an improved configuration for launching a single mode long wavelength transmission signal into existing multimode optical fiber networks.

Much of the installed based of optical fiber consists of multimode fiber. The problem addressed by this invention is that a significant amount of the installed multimode fiber base consists of inferior quality fiber where the bandwidth associated with the Over-Fill Launch (OFL) condition is not realized. In fact, approximately 10% of installed fiber can suffer bandwidth collapse with long wavelength laser transmitters when launched on axis or with a typical offset of 3 to 7 um for a multimode fiber connector. This has been a serious problem in the past, and has been the focus of many experts in this area for the past 15 years. As early as 1991, the U.S. Pat. No. 5,077,815 to Yoshizawa disclosed the general concept of launching the transmission signal down the multimode fiber offset from the optical axis of the core. Yoshizawa utilized a single mode optical fiber coupled to a laser diode, or LED, for launching the transmission signal into the core of the multimode fiber. The single mode fiber was butt-coupled to the end face of the multimode fiber with the core of the singe mode fiber offset from the optical axis of the multimode fiber. Alternate configurations using lenses to focus the optical radiation from the single mode fiber to the multimode fiber were also disclosed. The theoretical basis for the realized improvement in bandwidth was believed to be a preferential excitation of higher order mode groups as opposed to lower order mode groups.

In 1995 the U.S. Pat. No. 5,416,862 to Haas identified that adding an angle to either a center launch or an offset launch would further preferentially excite higher order mode groups traveling in the multimode fiber and would also increase bandwidth.

The most recent work in this area can be found in the U.S. Pat. No. 6,064,786 to Cunningham et al which describes a theoretical model that distinguishes preferential excitation of only mid-order modes. The primary configurations claimed in Cunningham use a long wavelength (1300 nm) Fabry Perot edge emitter diode, and require the use of a multimode collecting fiber for collecting optical radiation from the diode. Low order mode groups are excited in the collecting multimode fiber and are launched into a conducting multimode fiber offset from the optical axis of the conducting multimode fiber where they preferentially excite mid-order mode groups. One alternate configuration disclosed in the Cunningham '768 patent briefly describes the experimental testing of a short wavelength (850 nm) VCSEL operating in a single transverse mode and launching the VCSEL radiation into the multimode fiber offset from the optical axis of the core. However, practical use of the system was discounted due to power limitations of the VCSEL. The short wavelength VCSEL described in Cunningham would had to have been operated at a low power in order for it to lase in only a single transverse mode. For the most part, the '768 Cunningham patent seems to set forth an explanation of the theoretical reasons "why" offset launch provides better bandwidth.

Another practical solution for providing an offset launch into multimode fiber communication systems has been addressed by the GbE standards bodies by specifying a mode conditioning patchcord that is used to guarantee a known offset in the range 17 to 23 um for 62.5 um multimode fiber and 10 to 16 um for 50 um multimode fiber where the reduced number of excited modes guarantees satisfactory performance. The mode conditioning patchcord is an extra component used between a conventional single mode fiber transmitter (transceiver) and the multimode fiber system that guarantees the optimum launch condition. Further details of the multimode fiber patch cord configurations can be found in the U.S. Pat. No. 6,304,352 to Cunningham.

A further improved solution to this problem has been found and is the basis for the present invention. The fiber bandwidth demonstrated for the present invention is far better than predicted, and this has opened up a new commercial opportunity for data links on multimode fiber by extending the distances and data transfer speeds that can be accommodated.

SUMMARY OF THE INVENTION

In recent years, significant effort has gone into developing Long Wavelength Vertical Cavity Surface Emitting Lasers (VCSEL's). One long wavelength VCSEL material system specifically in current development is based on InGaAsN technology, but other material systems are also possible. These long wavelength VCSEL's now realize the low drive current and ease of packaging benefits previously realized with shorter wavelength VCSEL structures and are a significant technical advance from the prior art shorter wavelength VCSELs. The new long wavelength VCSEL's have been designed with efficient coupling into single mode fiber (SMF) in mind and have small, substantially circular emission spots in the range of 3 to 10 µm diameter and more preferably 6 to 7 µm diameter. These VCSEL devices also have a small numerical aperture (~0.1) that provides the opportunity for precise alignment and direct butt coupling to single mode fibers in some circumstances. The near parallel optical emission profile of these devices enables efficient optical coupling into single mode fiber where the core diameter is typically 9 um. Furthermore, the long wavelength VCSELs have been specifically designed to operate in a single longitudinal mode at high power levels and are now ready to replace the traditional Fabry Perot edge emitters commonly used at long wavelengths such as 1300 nm.

The present invention brings together the new single mode long wavelength VCSEL devices with the previous work in offset launch to realize a novel and unique transmitter/transceiver device for multimode fiber links where offset launch with controlled mode conditioning is achieved without the use of a mode conditioning patchcord, and in some embodiments, without the use of any collecting or focusing elements.

Experimental evidence from testing of the present invention has been collected and the results show that bandwidths considerably in excess of the overfill launch bandwidth of the multimode fiber has been demonstrated, and in fact, GbE (1.25 Gb/s) data rates have been transmitted over 2.8 km of multimode fiber, which is a factor of 5 better than previously thought.

The ideal offset launch has been found experimentally to be 20 um on 62.5 um MMF and this has been reliably achieved by translating the VCSEL device laterally from the center axis of the multimode fiber by a fixed amount and then fixing the VCSEL in place. This is an easy process in manufacture because of the VCSEL package configuration, and negates the need for a mode conditioning patchcord. The emission size of the long wavelength VCSELs, which were developed for single mode fiber applications, is fortuitously ideal for providing a restricted offset launch on multimode fibers. This novel application of long wavelength VCSEL technology to the problem of limited multimode fiber bandwidth now enables the manufacture of very low cost transmitters capable of distances previously unattainable.

Accordingly, among the objects of the instant invention are:

the provision of a new way of achieving improved fiber bandwidth on multimode fiber using long wavelength VCSEL devices;

the provision of a new launching technique which removes the need for a mode conditioning patchcord specified in the standards;

the provision of such a new configuration wherein the long wavelength VCSEL could have a 1300 nm emission wavelength but which could equally be any wavelength in the long wavelength communications band (1100 nm to 1700 nm);

the provision of a low cost assembly technique for guaranteeing the optimum offset launch condition into multimode fiber systems; and the provision of such techniques which enhance the bandwidth of multimode fiber and therefore achieve longer transmission distances than previously possible on multimode fiber, for example, >2 km at GbE but whilst this is an example of what has been achieved, other data rates and distances are possible (e.g. 10 GbE over 300 m).

Other objects, features and advantages of the invention shall become apparent as the description thereof proceeds when considered in connection with the accompanying illustrative drawings.

BRIEF DESCRIPTION OF THE DRAWING FIGURES

In the drawings which illustrate the best modes presently contemplated for carrying out the present invention:

FIG. 4 is a perspective view of a GigaBit Interface Converter (GBIC) Module including the TOSA package illustrated in FIG. 3;

DESCRIPTION OF THE PREFERRED EMBODIMENT

Figure 1:
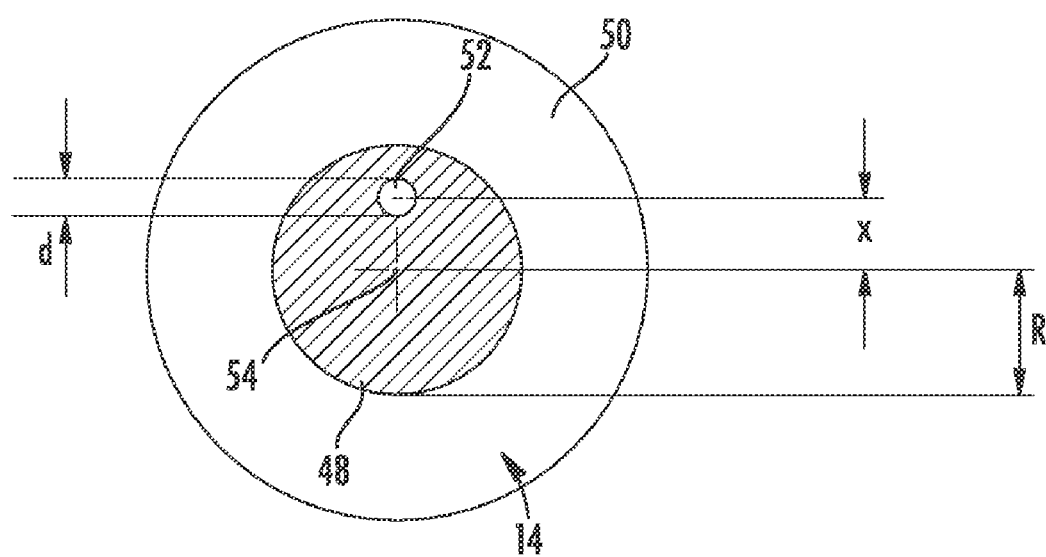
FIG. 1 is an end view of a multimode fiber (MMF) showing the VCSEL illuminating a spot offset from the optical axis of the MMF.

Referring now to the drawings, a multimode optical fiber communication system including an offset launch long wavelength VCSEL transceiver constructed in accordance with the present invention is illustrated and generally indicated at 10 in FIGS. 1 through 7. As will hereinafter be more fully described, the instant multimode optical fiber communication system is operative for communicating data between two remote nodes in a computer network. Each node in the network includes a router device generally indicated at 12 in FIG. 7. Each router 12 is typically configured to accept one or more transceiver devices 10 (See FIGS. 4–7) for transmitting data to and receiving data from another location(s). Each transceiver 10 includes a transmitter and a receiver operative with a pair of optical communication fibers 14 thus forming a bi-directional data link. The present invention is specifically directed to a novel offset launch transmitter that permits two router devices 12 to communicate at higher speeds and over longer distances utilizing an installed base of multimode fibers 14.

Figure 6:
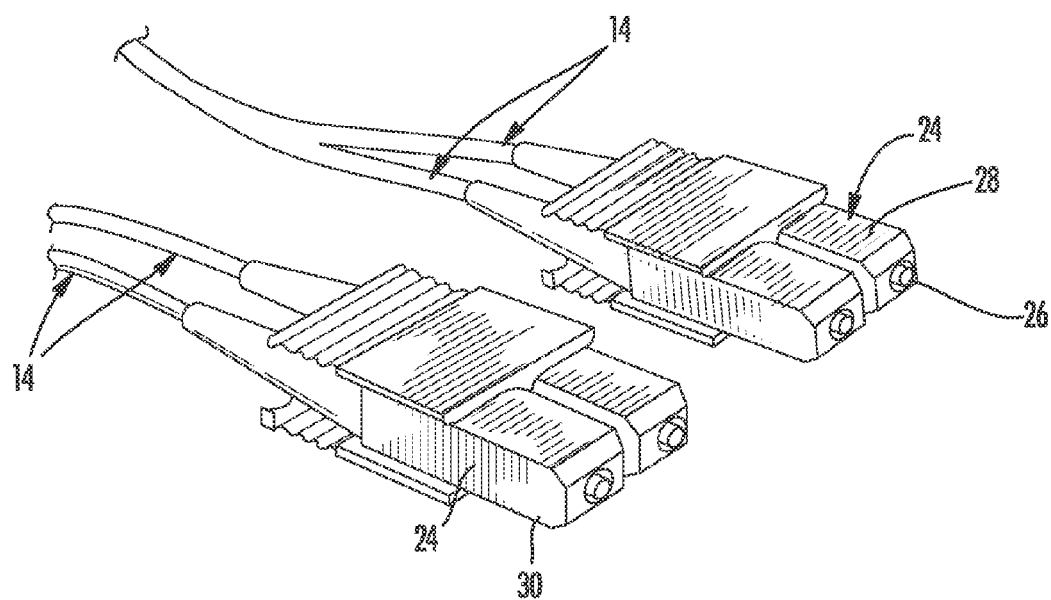
FIG. 6 is a perspective view of multimode fiber pairs terminated with SC connector plugs.
Figure 7:
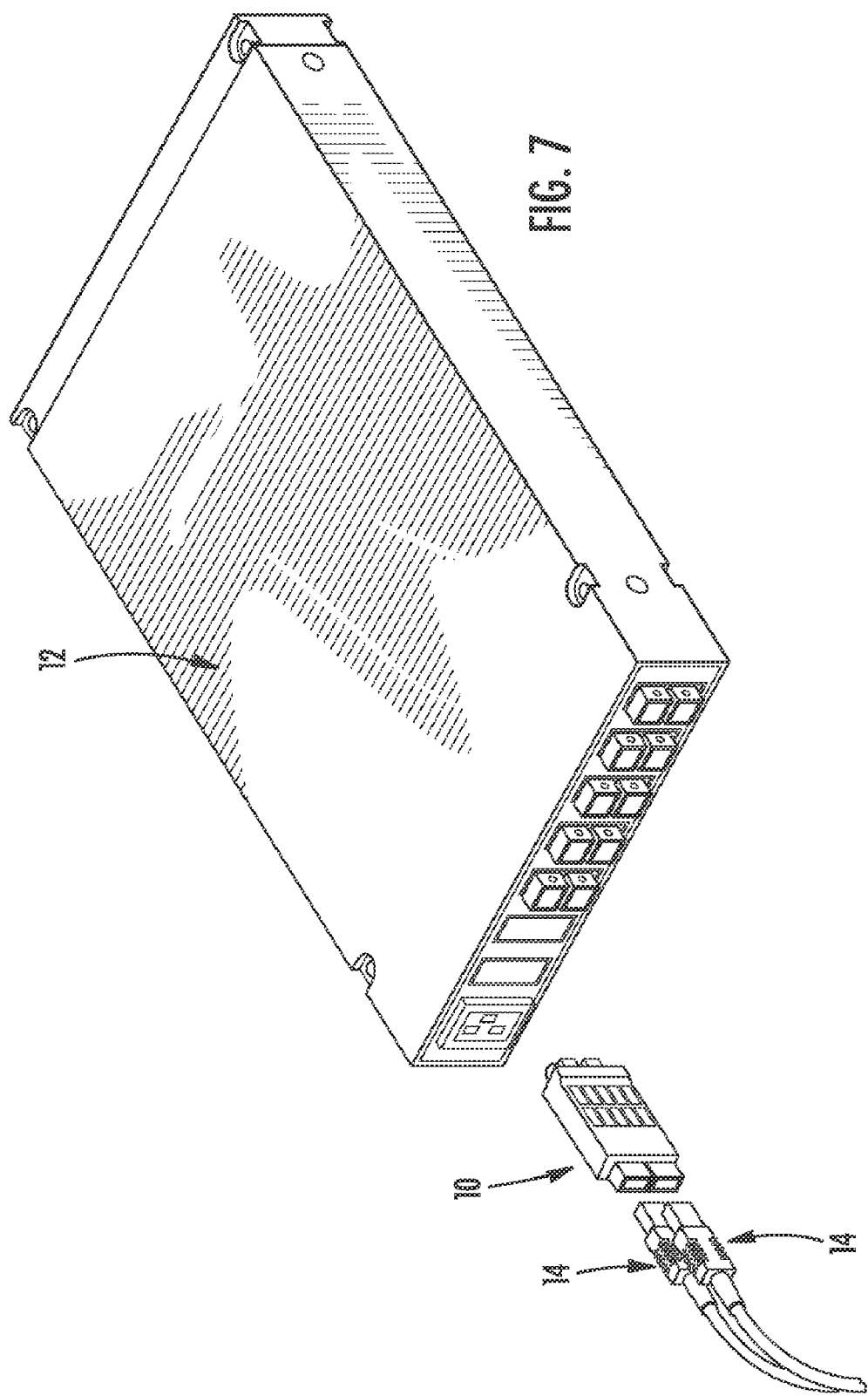
FIG. 7 is a perspective view of a communication system showing connection of the GBIC module with a router device and connection of the multimode fiber pair with the GBIC.

Turning to FIGS. 4–7, there is shown a GBIC form factor communication system. The GBIC form factor is standardized in the industry and is well known in the art. FIG. 4 illustrates a GBIC transceiver module 10 comprising a housing generally indicated at 16 having a first end 18 and a second end 20 and a fiber connector structure 22 at the first end 18 for directly receiving connectorized ends 24 of the multimode fibers 14. The GBIC form factor utilizes a standardized SC fiber connector system as illustrated in FIG. 6. The individual fibers 14 are terminated with a ferrule 26, an outer shroud 24 and a latching structure 30 for selectively engaging with the fiber connector structure 22 on the housing 16 of the transceiver module 10.

Step-by-step assembly of the GBIC module 10 is illustrated in FIGS. 5A–5H. The transceiver module 10 comprises upper and lower housing parts 32, 24 respectively (FIGS. 4 and 5A), a latch structure 36 including latch tabs 38 at the first end 18 within the fiber connector structure 22 (FIG. 5B), a circuit card 40 mounted within said housing 16 (FIG. 5E), a transmitter optical subassembly 42 mounted to the circuit card 40 adjacent the fiber connector structure 22 (FIGS. 5C–5E), a receiver optical subassembly 44 mounted to the circuit board 40 adjacent the fiber connector structure 22 (FIGS. 5C–5E), and an electrical connector 46 at the second end 20 of the housing 16 (FIG. 5E), the electrical connector 46 being connected to the circuit card 40 and protruding from the second end 20 of the housing 16 for selectively connecting the circuit card 40 with a mating receptacle (not shown) mounted inside the router 12.

It is noted there are many form factors for optoelectronic transceiver configurations (GBIC, SFF, SFP, XFP etc), and those skilled in the art will appreciate that the GBIC form factor is not critical to the invention.

Referring back to FIG. 1, the multimode fibers 14, are part of an installed base of multimode fibers. Each of the multimode fibers 14 comprises a core 48 and an external cladding layer 50. The multimode fiber 14 may typically have either a 50 μm core or a 62.5 μm core. In FIG. 1, the radius of the core 48 is indicated as R, the diameter of the beam spot 52 is indicated as d, and the offset dimension of the beam spot 52 from the optical axis 54 of the multimode fiber 14 is indicated as X.

The source of optical radiation for the offset launch transmitter comprises a single mode long wavelength VCSEL generally indicated at 56. For purposes of the present invention, long wavelength is generally defined as operating in the 1300 nm optical communication window. However, it is to be understood that the present invention is applicable to all communication windows in the long wavelength band generally ranging from 1000 nm to 1700 nm.

Generally speaking, the VCSEL device 56 preferably has a beam spot diameter d of approximately 6–7 μm. However, the beam spot 52 may range in diameter from about 3 μm to about 9 μm. As discussed previously, the long wavelength VCSEL's as utilized in the present invention were originally designed for launching optical radiation into the smaller core (~9 μm) of a single mode fiber. They are generally constructed to emit a small circular spot, as opposed to an elliptical spot for edge emitters, and have a small (~0.1) numerical aperture (NA), as opposed to a larger NA (~0.4) for edge emitters. More specific details of the VCSEL structure and operation are disclosed in co-pending U.S. patent application Ser. No. 10/122,707 entitled "Long Wavelength Vertical Cavity Surface Emitting Laser", (US Patent Publication No. 2002/0150135) and Ser. No. 10/613,652 entitled "Method of Self Aligning an oxide aperture with an annular intra-cavity contact in a long wavelength VCSEL" (US Patent Publication No. 2004/0058467), the contents of which are both incorporated herein by reference.

Figure 2A:
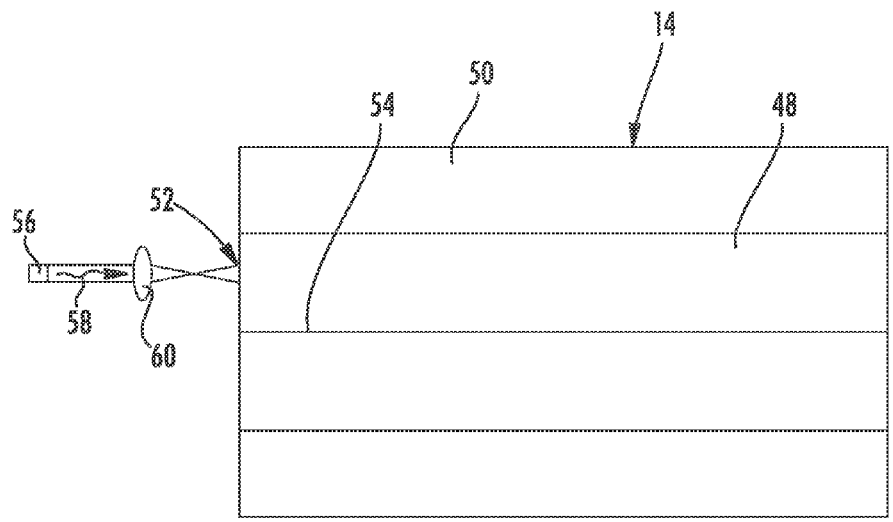
FIG. 2A is a schematic view of a first embodiment with a 1300 nm VCSEL and lens coupled to the multimode fiber.
Figure 2B:
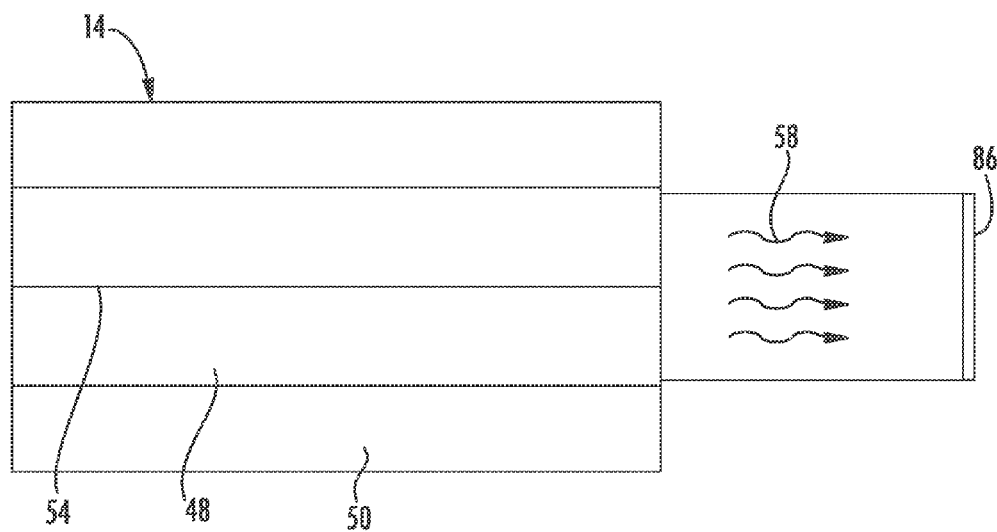
FIG. 2B is a schematic view illustrating exit of the transmission signal from the multimode fiber and collection of the signal by a wide angle photodetector.

Turning to FIGS. 2A and 2B, a schematic diagram of a first embodiment of the offset launch configuration is illustrated wherein the VCSEL transmission signal 58 is offset launched into the core 50 of the multimode fiber 14 with the help of a lens 60 to focus the laser output. The lens 60 operates to focus and size the launch beam 52 at the offset launch point on the end face of the fiber 14. In this embodiment, both the VCSEL 56 and the lens 60 are positioned offset from the fiber axis 54.

The ideal offset launch has been found experimentally to be 20 um on 62.5 um MMF and this has been reliably achieved by translating the VCSEL device 56 laterally from the center axis 54 of the multimode fiber 14 by a fixed amount and then fixing the VCSEL 56 in place. This is an easy process in manufacture and negates the need for a mode conditioning patchcord.

Figure 3:
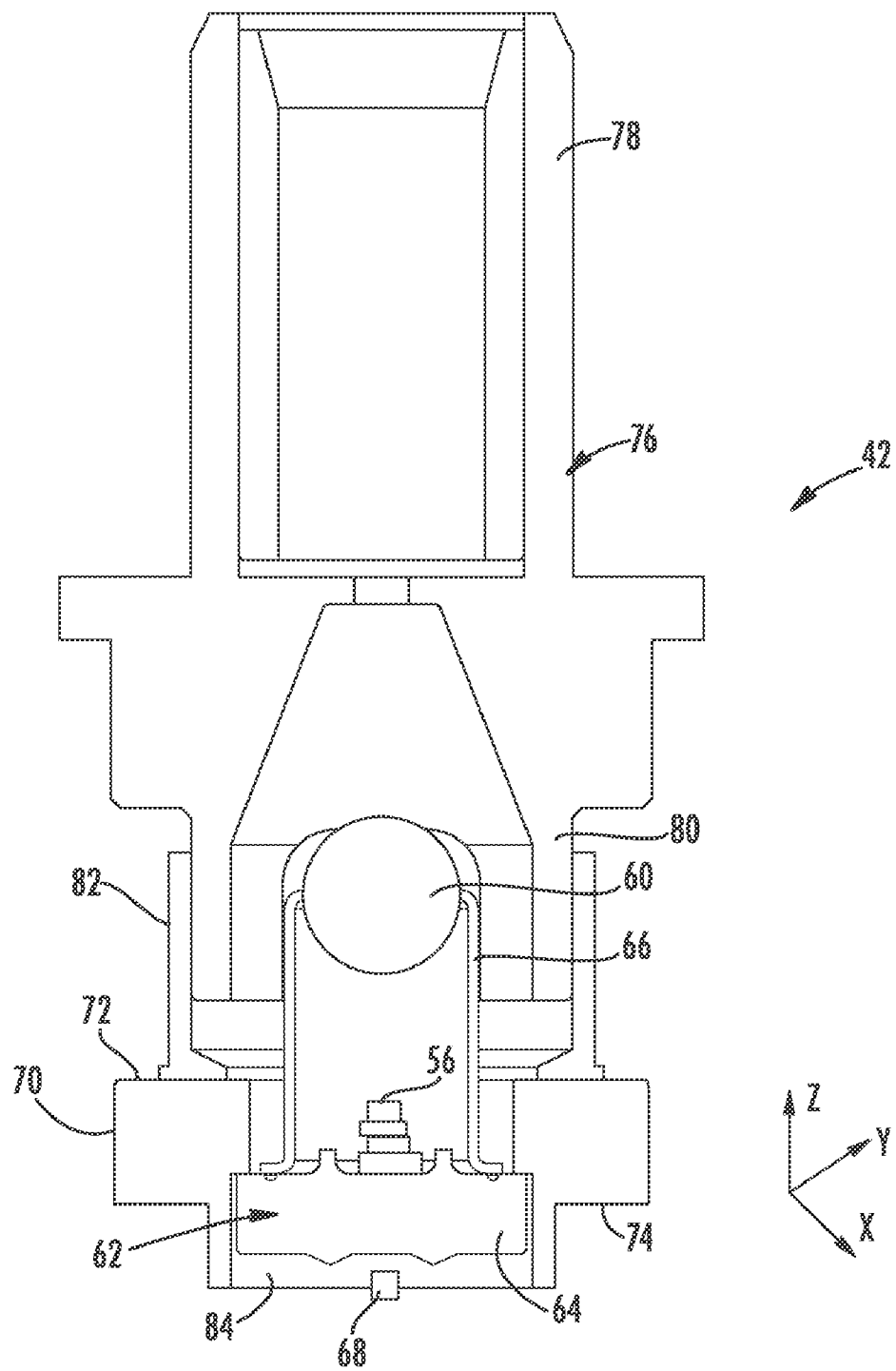
FIG. 3 is a cross-sectional view of a transmitter optical sub-assembly (TOSA) package constructed in accordance with the present invention.
Figure 5A:
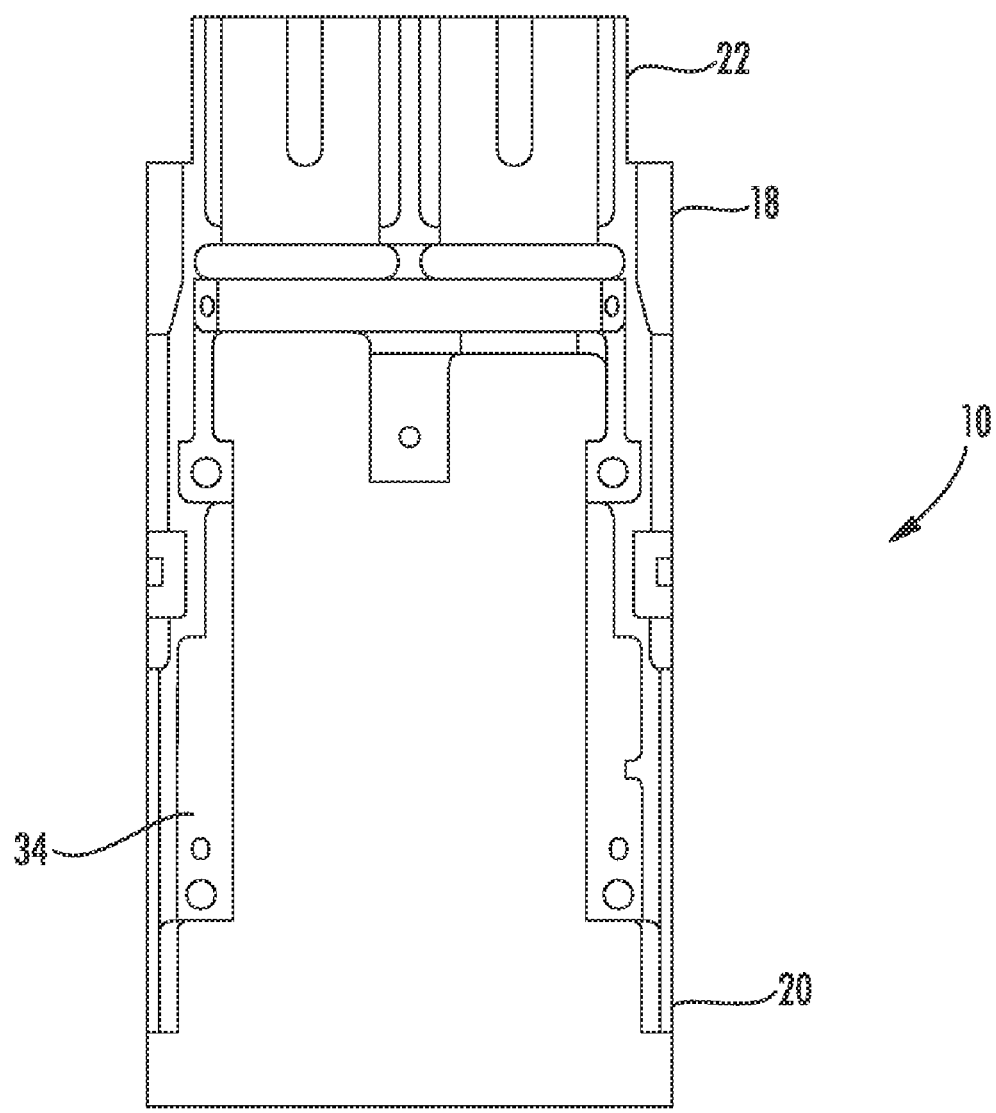
FIGS. 5A through 5H are plan views showing assembly of the GBIC module.
Figure 5B:
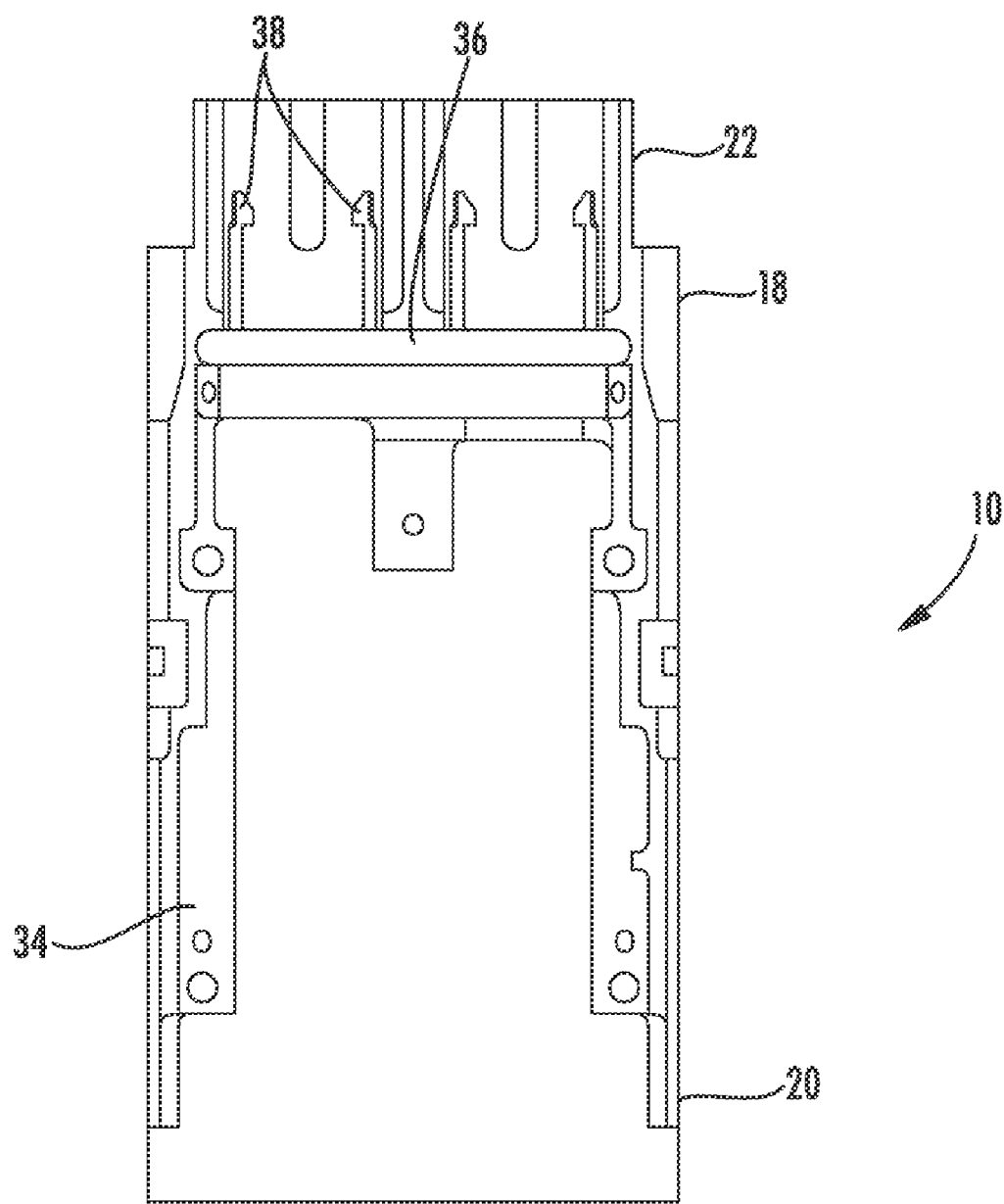
Figure 5C:
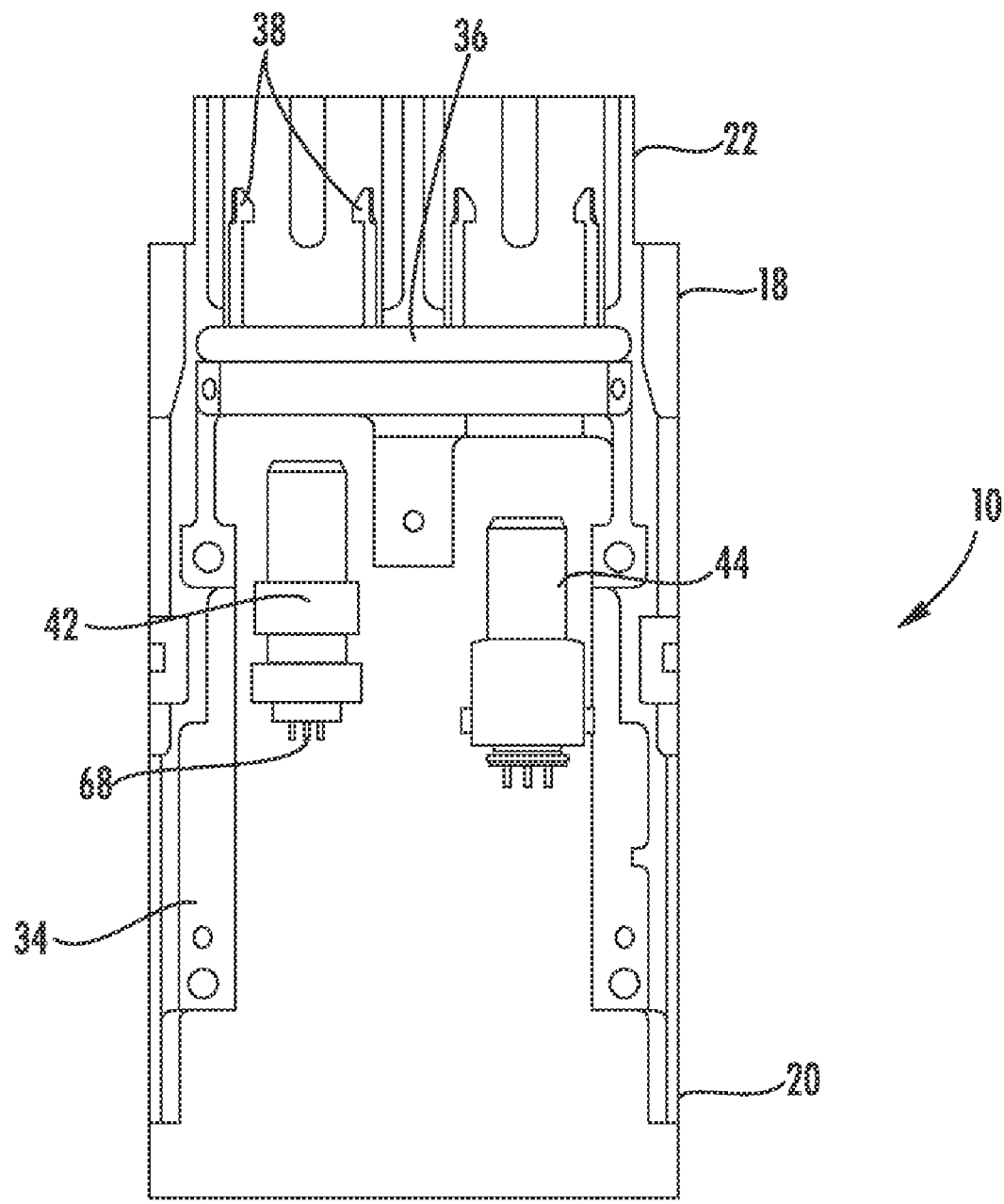
Figure 5D:
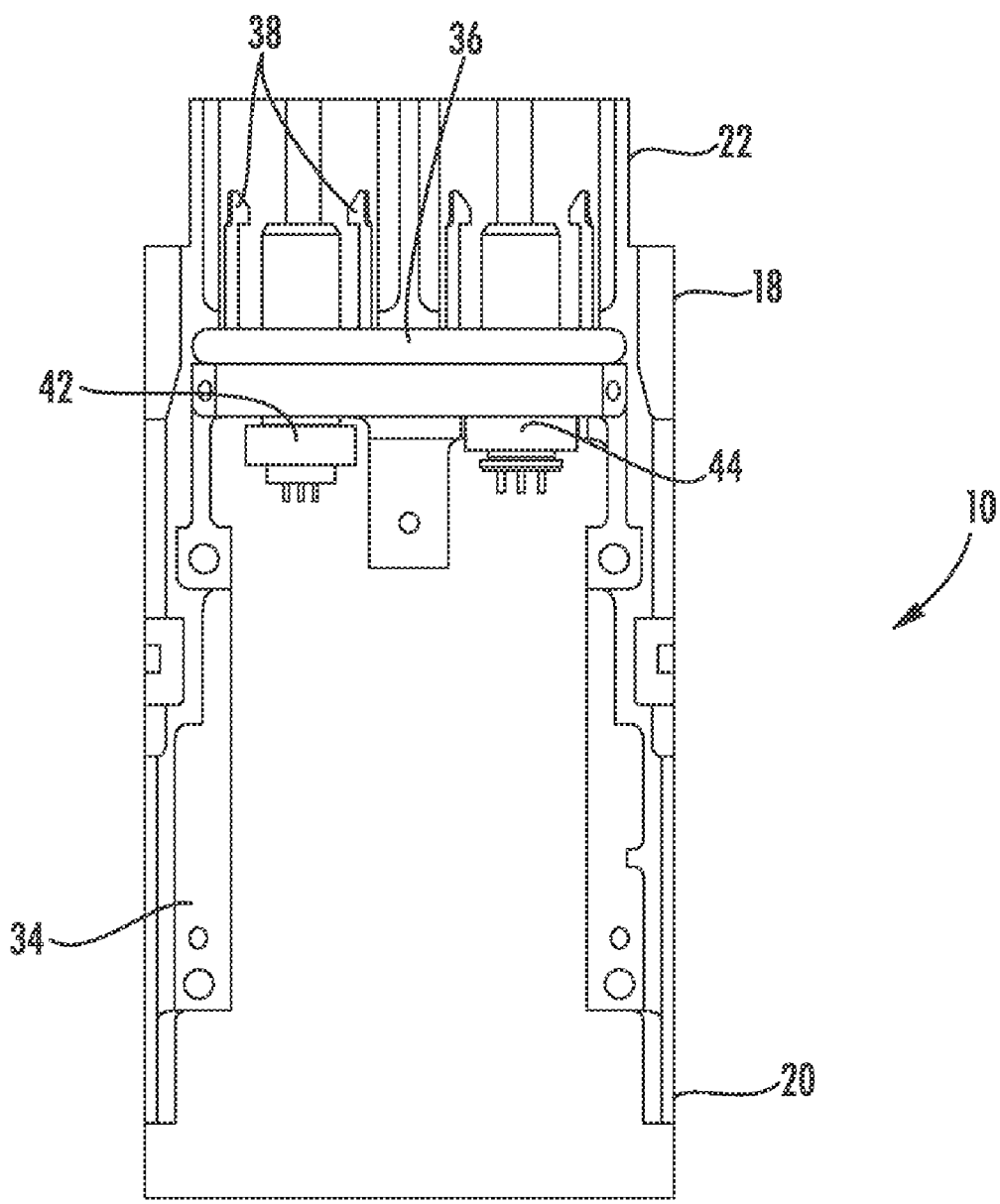
Figure 5E:
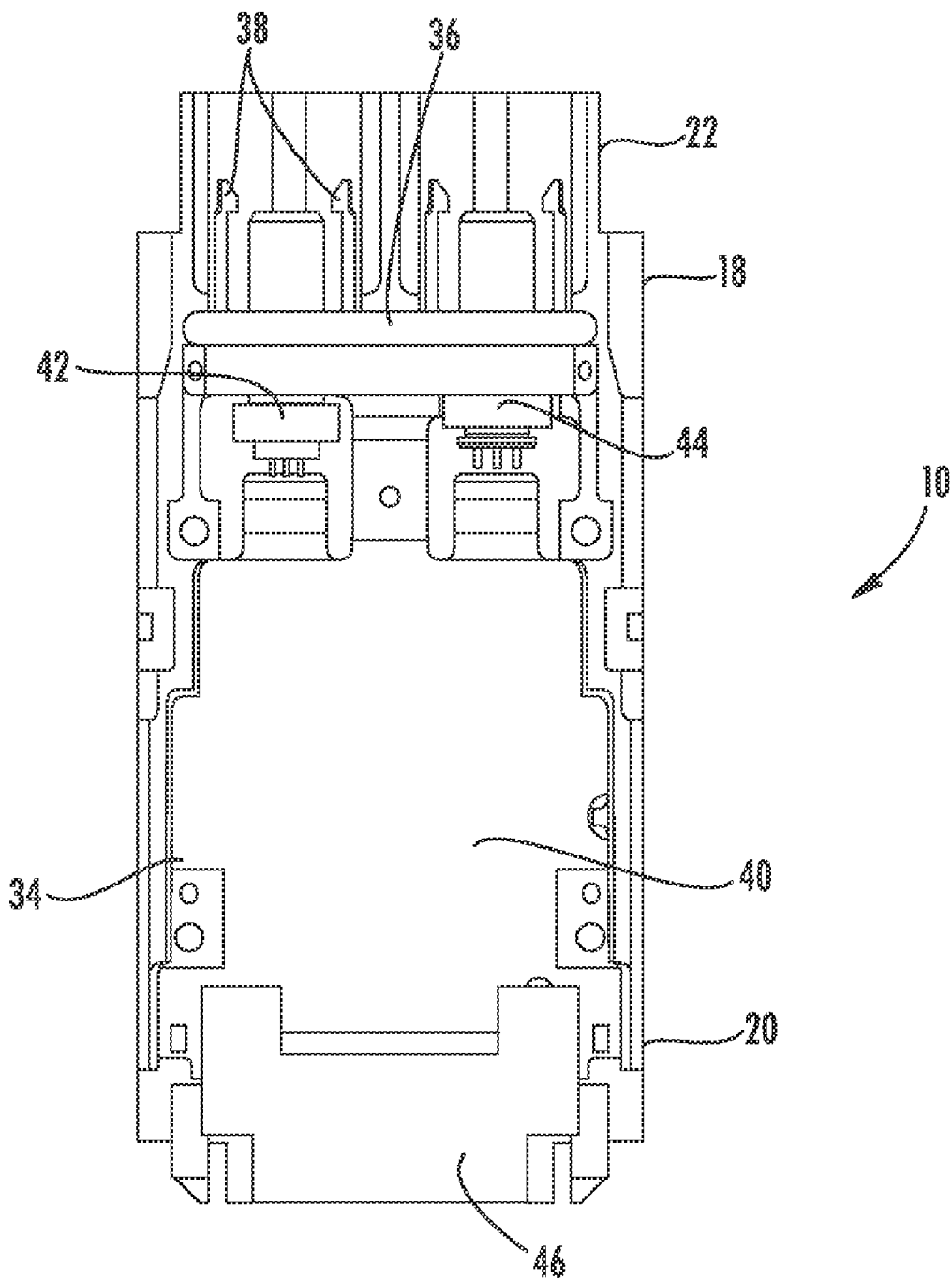
Figure 5F:
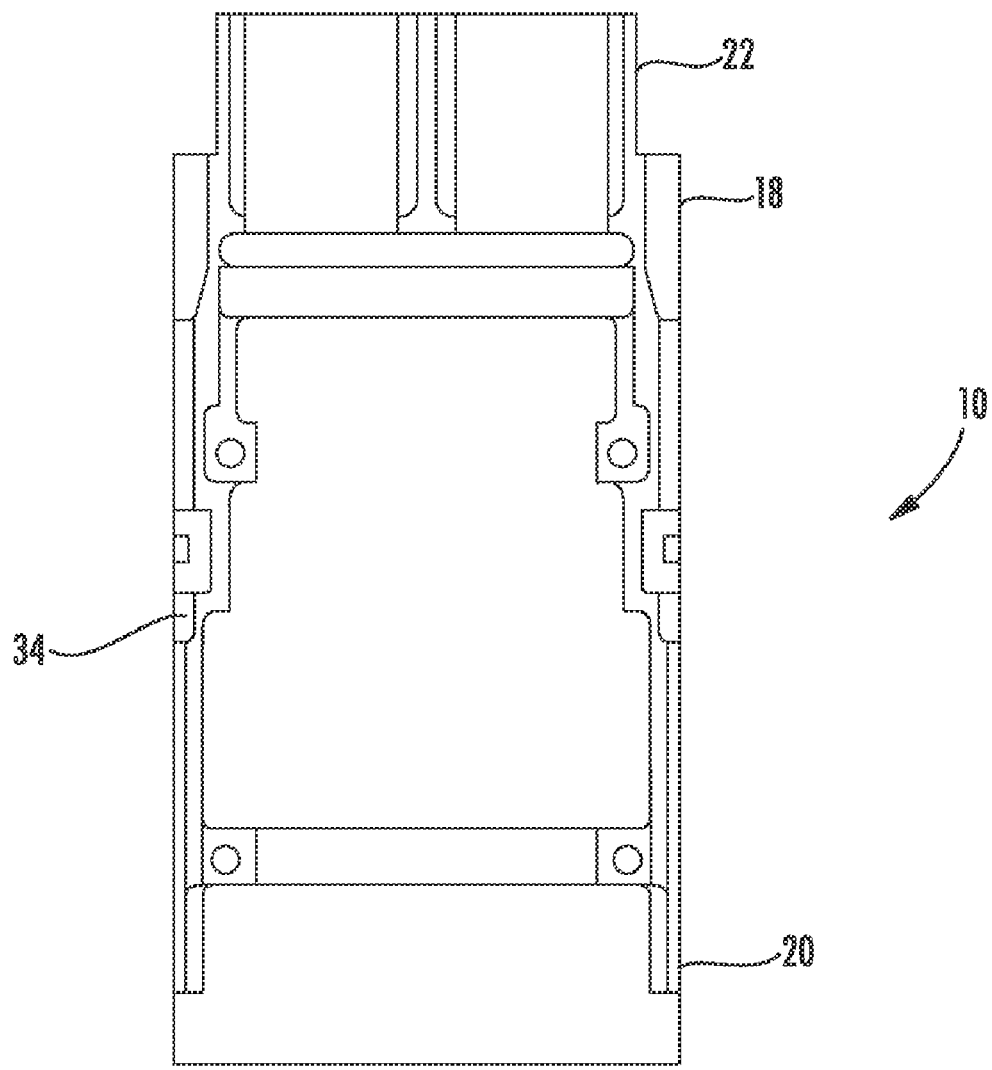
Figure 5G:
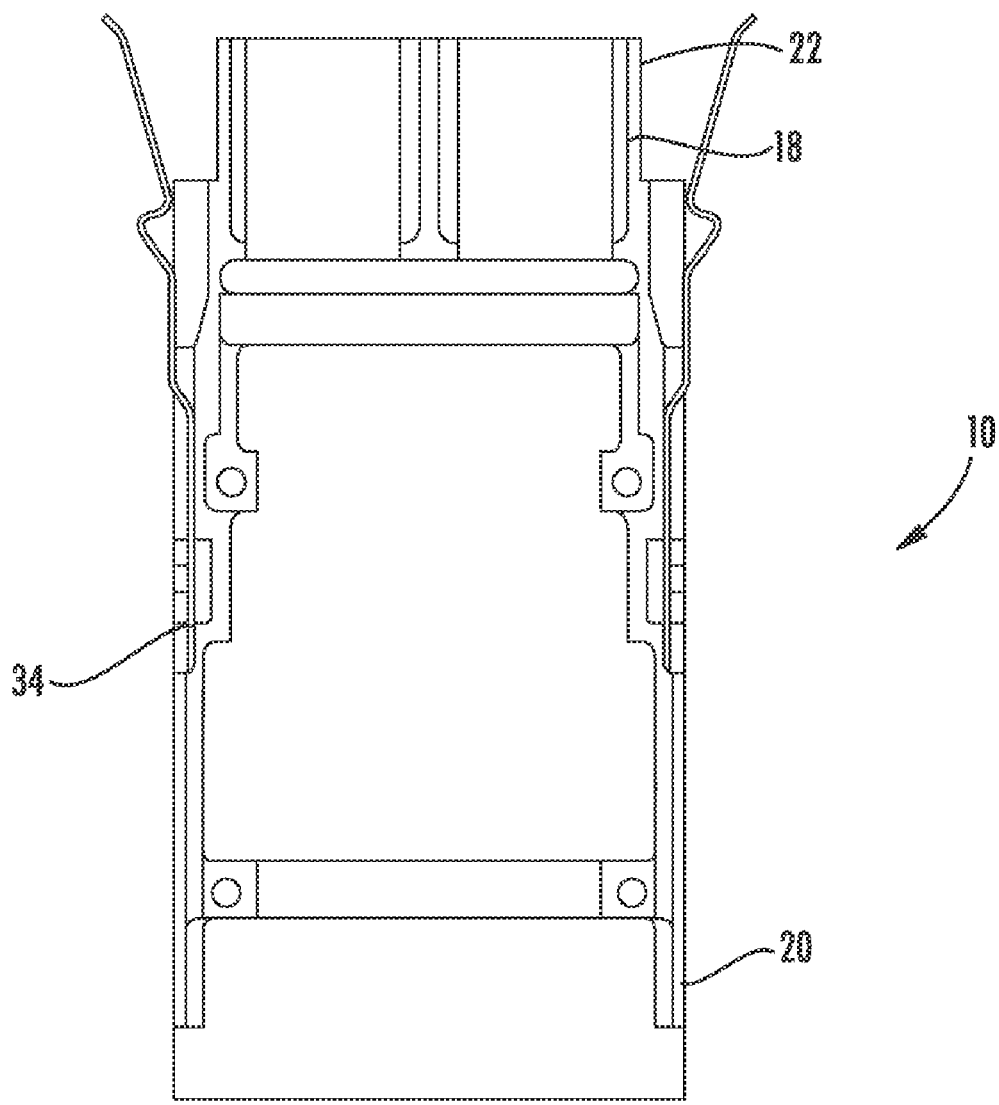
Figure 5H:
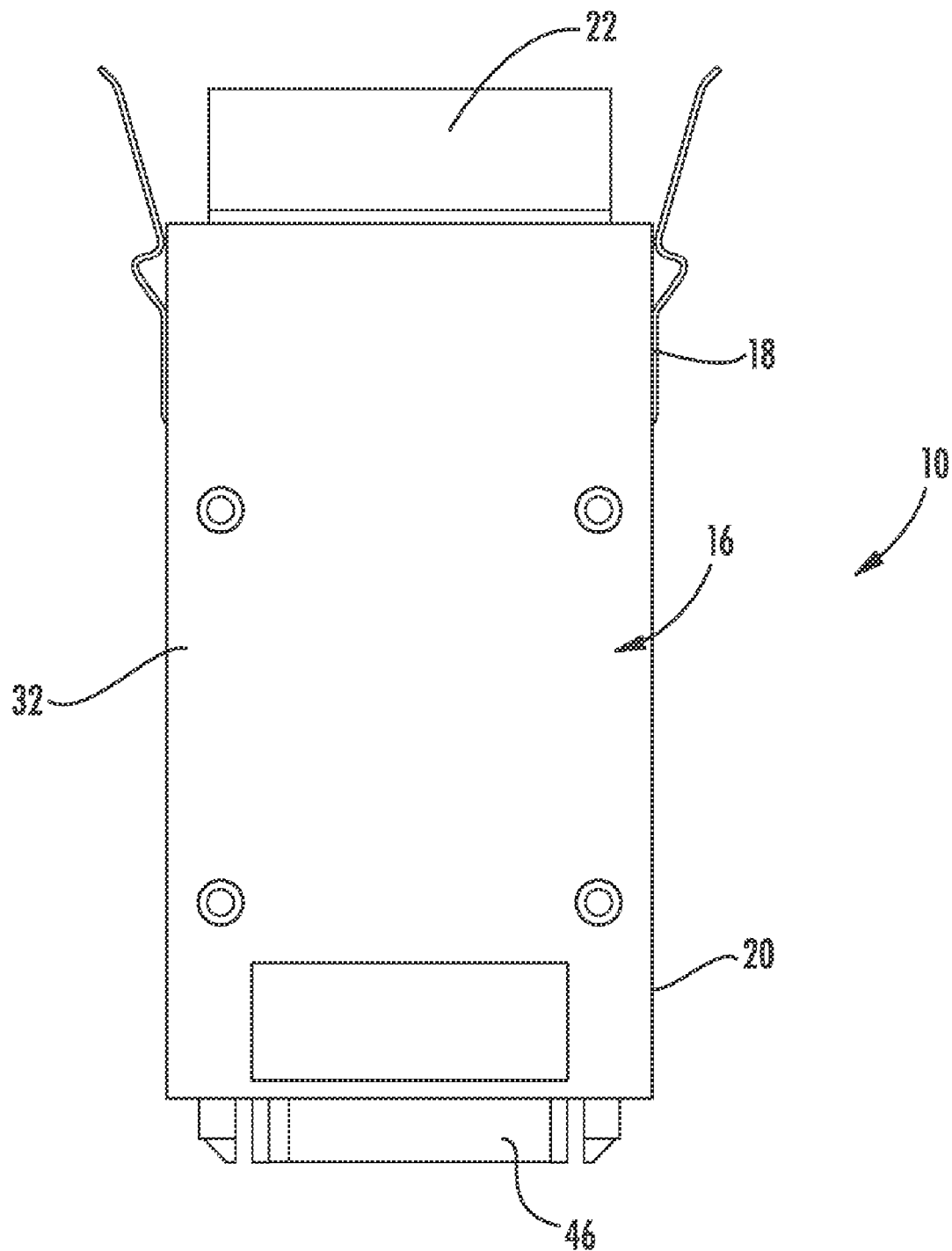

Turning to FIG. 3, the VCSEL 54 and lens 60 are assembled into a TO-38 package generally indicated at 62. The TO-38 package 62 including a header 64, and a can enclosure 66. The VCSEL 56 is mounted onto the header 64 and provided with conventional electrical contacts 68 (See also FIGS. 5C–5G) that extend through the header 64 for connection with the circuit card 40. The lens 60 is hermetically sealed at the top of the can enclosure 66. The VCSEL 56 is aligned with the optical axis of the lens 50 which defines the optical axis of the TO-38 package 62.

Still referring to FIG. 3, the transmitter optical subassembly 42 comprises an annular base 70 having an upper surface 72 and a lower surface 74, and a receptacle 76 having a first end 78 for receiving the connectorized end 24 of a multimode fiber 14 and further having a second end 80 which is received in assembled relation with the upper surface 72 of the base 70. A weld sleeve 82 is affixed to the upper surface 72 of the base 70 for slidably receiving the second end 80 of the receptacle 76. During assembly, the TO-38 package 62 is received within a recess 84 in the bottom surface 74 of the base 70. The recess 84 is slightly larger in diameter than the header 64 of the TO-38 package 62 so that the TO-38 package 62 can be laterally translated within the base 70 in the x-y plane to provide the proper offset alignment with the core 48 of the multimode fiber 14 to be received in the first end 78 of the receptacle 76. During this alignment, the TO-38 package 62 is also provided with a slight angle (0–10°) along the z-axis to reduce back reflection of the optical radiation (transmission signal) off the end surface of the multimode fiber 14. Once a rough alignment of the TO-38 package 62 is completed, the TO-38 header 64 is secured to the base 70, and a fine alignment is completed by translation of the receptacle assembly 76 relative to the base 70.

Generally speaking, the VCSEL 56 and lens 60 are cooperatively positioned within the receptacle 76 to direct the transmission signal 58 onto the core 48 of the multimode fiber 14 offset from the optical axis 54 of the core 48 when the connectorized transmitting end 24 of the multimode fiber 14 is received in the fiber connector structure 22.

The receiver optical subassembly 44 (FIG. 5C) is virtually identical to the transmitter optical subassembly 42, with the exception of the VCSEL 56 being replaced by a wide-angle photodetector 86 capable of collecting all of the transmission signal 58 exiting the terminal end of the multimode fiber 14 (See FIG. 2B). A separate illustration of the detailed construction of the receiver optical subassembly 44 is not believed to be necessary for an understanding of the invention.

Figure 10A:
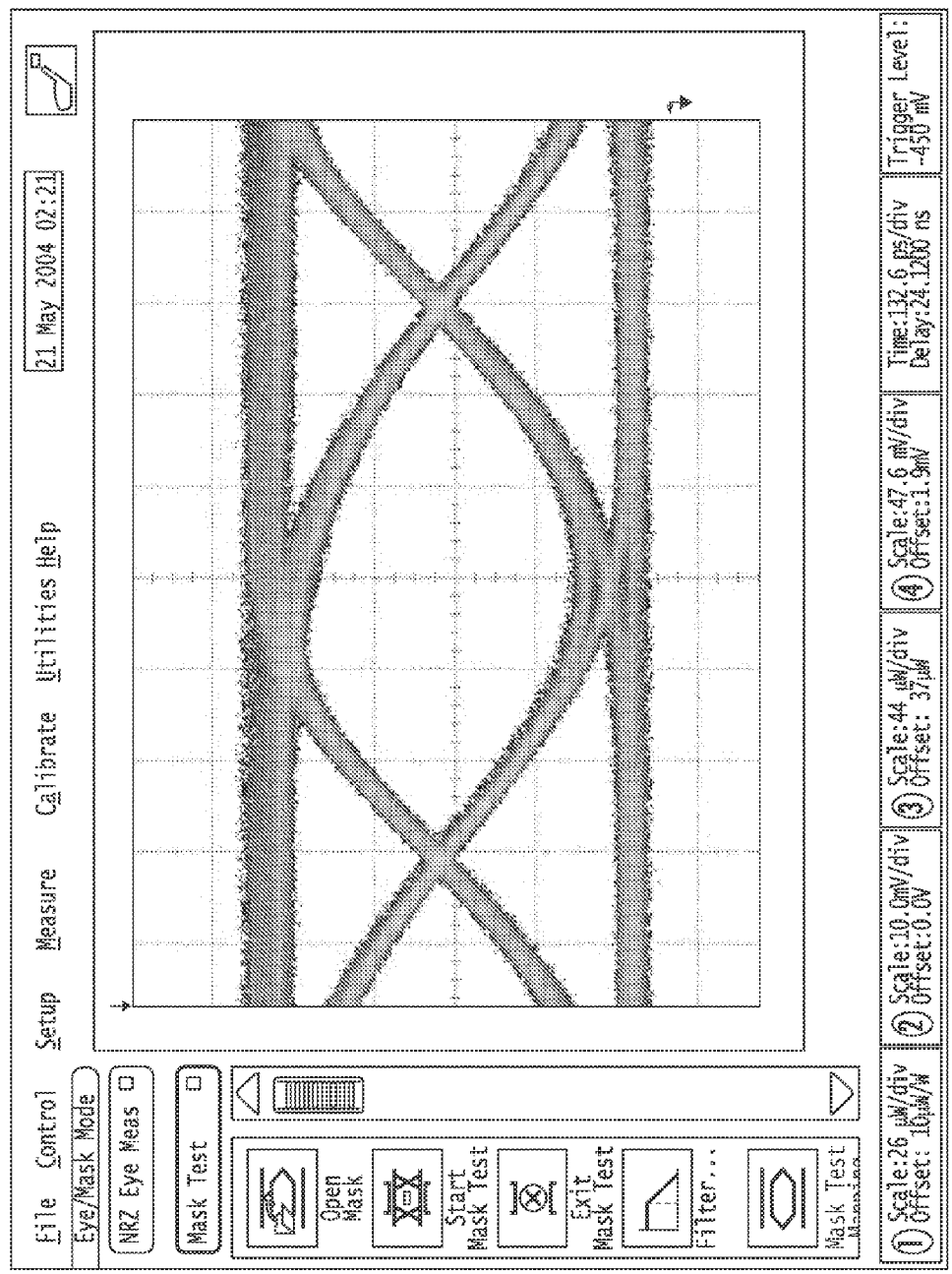
FIGS. 10A–10C are graphical illustrations of eye diagrams showing signal strength at 2800 m for (A) Offset single mode VCSEL launch, (B) on axis Fabry-Perot laser launch and, (C) 850 nm multimode VCSEL on axis launch.
Figure 10B:
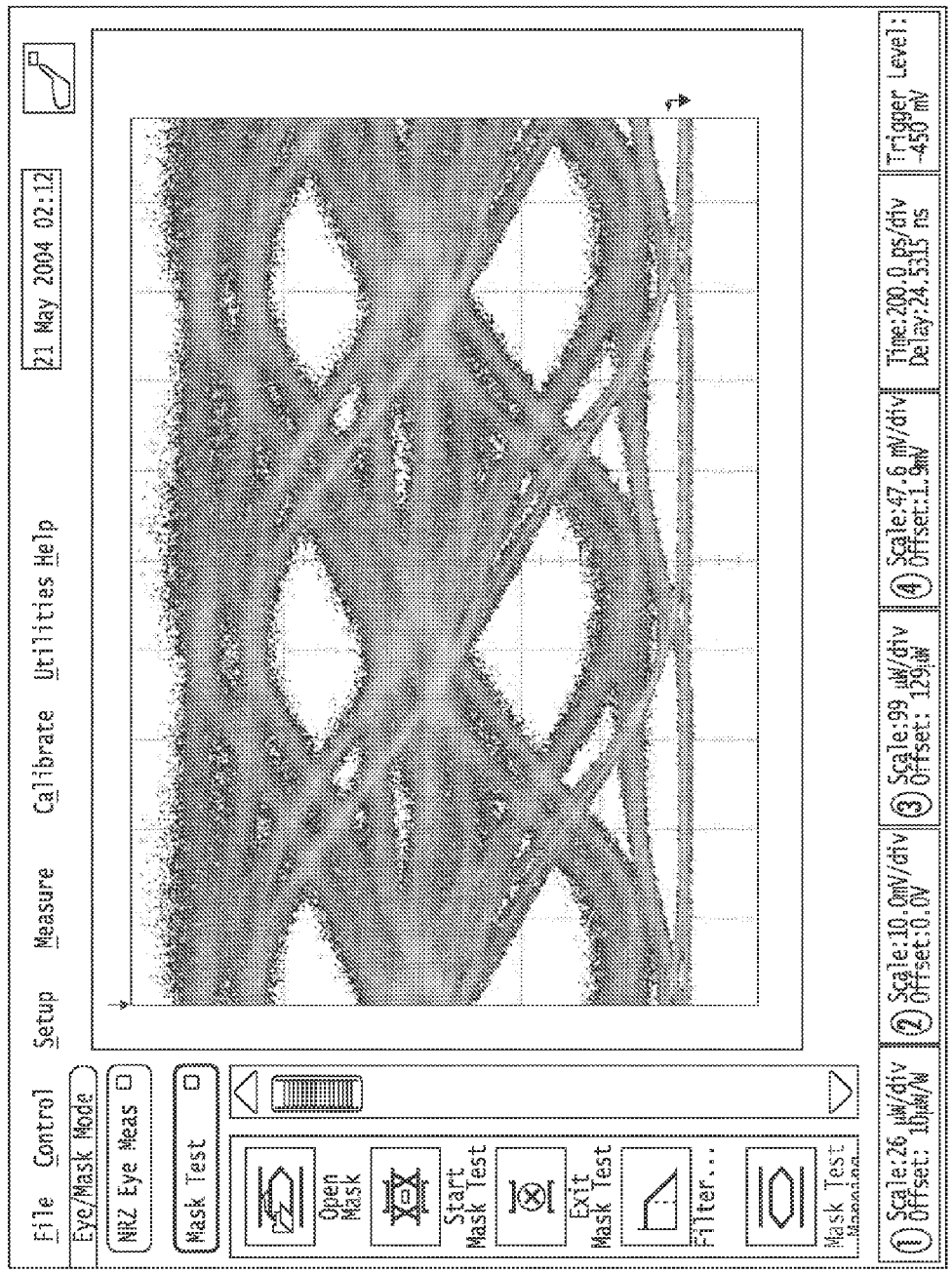
Figure 10C:
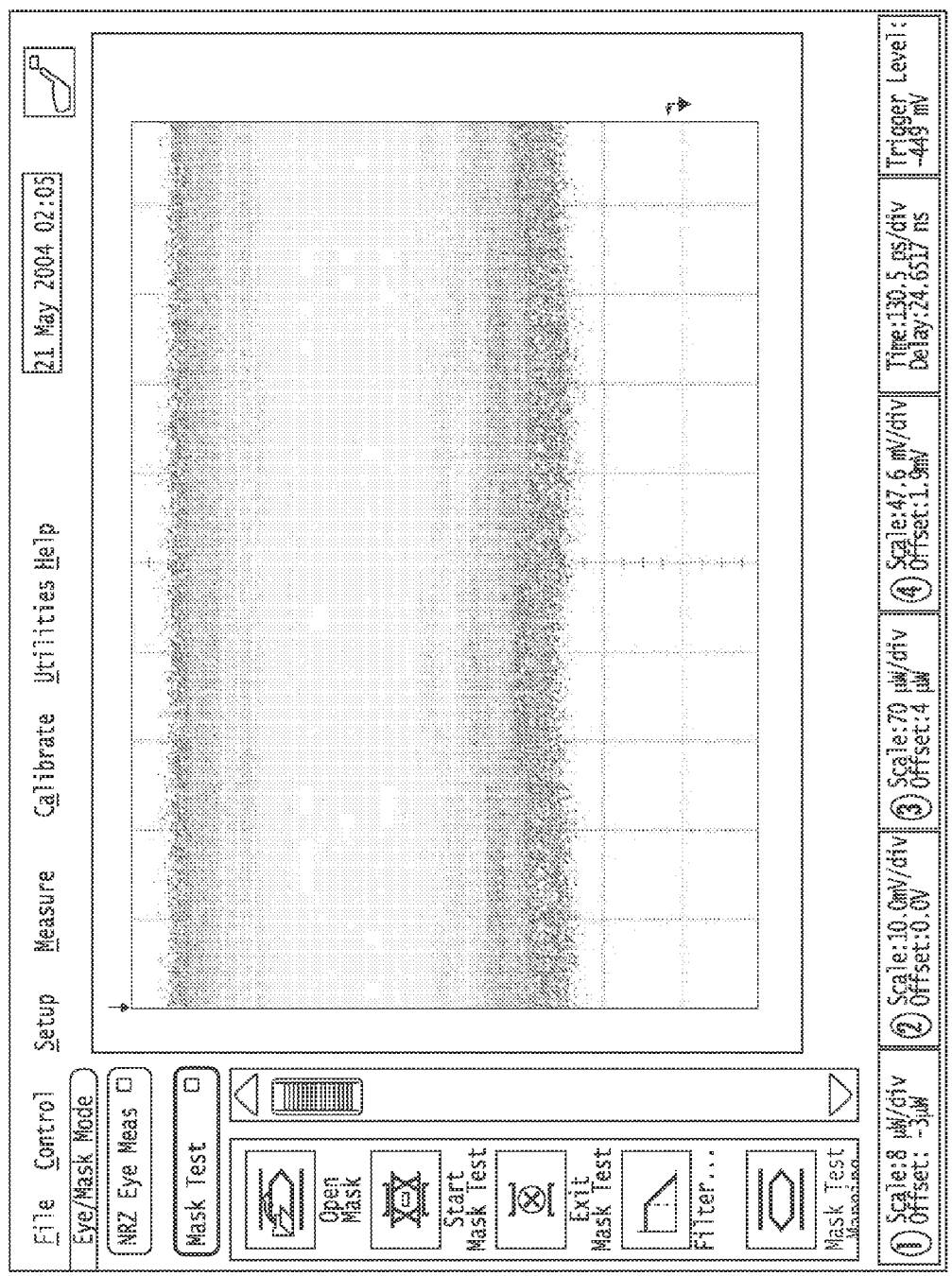

Experimental evidence has been collected which shows that bandwidths considerably in excess of the OFL bandwidth of the MMF has been demonstrated and in fact, GbE (1.25 Gb/s) data rate has been transmitted over 2.8 km of multimode fiber which is a factor of 5 better than previously thought. In this regard, FIGS. 10A–10C are graphical illustrations of eye diagrams showing experimental evidence of signal strength at 2800 m for (A) offset single mode VCSEL launch (present invention), (B) on axis Fabry-Perot laser launch and, (C) 850 nm multimode VCSEL on axis launch.

Figure 8:
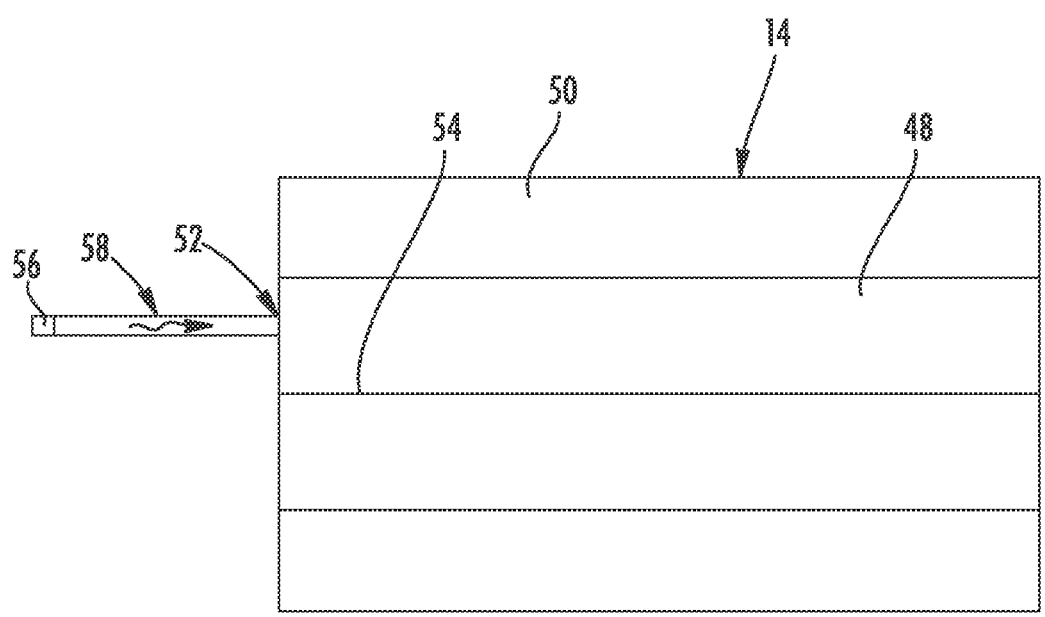
FIG. 8 is a schematic view of a second embodiment with a 1300 nm VCSEL butt coupled to a multimode fiber.

In a second embodiment as shown in FIG. 8, the VCSEL 56 is mounted normal to the end surface of the fiber 14, and the transmission beam 58 is launched directly into the core 48 at an offset of approximately 20 μm from the optical axis 54 of the core 48. In this particular embodiment, the transmission signal 58 is launched directly into the core 48 of the multimode fiber 14 without an intermediate collecting element, i.e. lens 60. More specifically, the TO-38 package 62 is provided with a window (not shown) rather than the lens at the top of the can enclosure 66, and the TO-38 package 62 is mounted immediately adjacent to the end surface of the multimode fiber 14, i.e. eliminating the extra distance required for the focal length of the lens 60. This arrangement is advantageous for simplifying manufacture of the TO-38 package 62 as there is no need to optically align a lens 60 with the VCSEL 56. Furthermore, the length of the entire transmitter optical subassembly 42 would be shortened considerably. A separate illustration of the lenless TOSA 42 is not believed to be necessary for an understanding of the invention.

Figure 9:
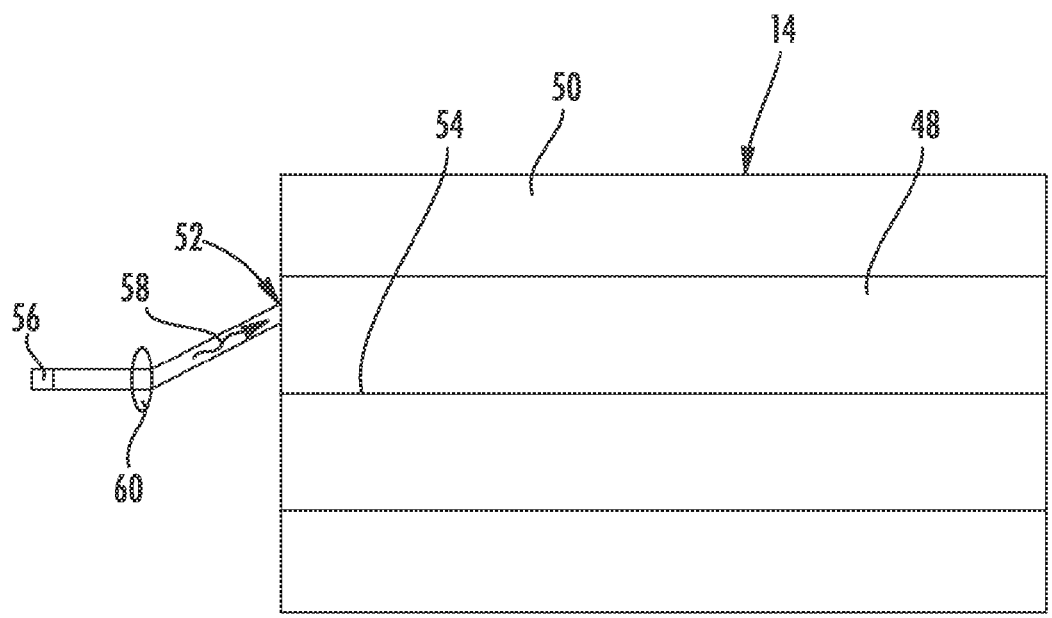
FIG. 9 is a schematic view of a third embodiment with a 1300 nm VCSEL and angular lens coupled to a multimode fiber.

Turning to FIG. 9, a third embodiment is disclosed wherein the VCSEL 56 and the lens 60 are positioned on axis and the launch beam is offset launched at an angle into the core by directing the launch beam 58 at an angle from the lens 60. The transmitter optical assembly 42 in this embodiment would be identical to that disclosed above in the first embodiment. However, the optical axis of the TO-38 package 62 would be fixed in alignment with the optical axis 54 of the core 48 of the multimode fiber 14, and then angled along the z-axis to provide both the offset launch and the angled entry of the beam 58 into the core 48.

It is noted that the angular launch can also be achieved by butt coupling the VCSEL in an orientation angled to the end surface of the multimode fiber. The angled butt couple launch thus provides a fourth alternative configuration.

It can therefore be seen that the present invention provides a unique and novel long wavelength transmission system that makes use of the existing installed base of multimode fiber yet increases transmission distance and bandwidth. For these reasons, the instant invention is believed to represent a significant advancement in the art that has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A transmitter for use in a multimode fiber communication system, said transmitter comprising:
 an optical source comprising a single mode, long wavelength vertical cavity surface emitting laser outputting optical radiation in a substantially circular beam spot, said laser having a symmetric numerical aperture of about 0.1 and a beam spot diameter of between about 3 µm to about 10 µm; and
 a collecting element for collecting said optical radiation output from the laser and directing said optical radiation onto the end face of a multimode fiber,
 said laser and said collecting element being cooperatively positioned to direct said optical radiation onto the core of the multimode fiber offset from the optical axis of said core.

2. The transmitter of claim 1 wherein said laser and said collecting element are cooperatively positioned to direct said optical radiation at an angle to the end face of said multimode fiber such that back reflection is reduced.

3. The transmitter of claim 1 wherein said beam spot is about 6–7 µm in diameter.

* * * * *